(12) United States Patent
Hashimoto

(10) Patent No.: US 11,069,843 B2
(45) Date of Patent: Jul. 20, 2021

(54) LIGHT-EMITTING DEVICE

(71) Applicant: NICHIA CORPORATION, Anan (JP)

(72) Inventor: Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 40 days.

(21) Appl. No.: 16/586,398

(22) Filed: Sep. 27, 2019

(65) Prior Publication Data

US 2020/0105988 A1 Apr. 2, 2020

(30) Foreign Application Priority Data

Sep. 28, 2018 (JP) .............................. JP2018-184103

(51) Int. Cl.
| | |
|---|---|
| *H01L 33/58* | (2010.01) |
| *H01L 33/60* | (2010.01) |
| *H01L 33/50* | (2010.01) |
| *H01L 33/52* | (2010.01) |

(52) U.S. Cl.
CPC ............ *H01L 33/58* (2013.01); *H01L 33/505* (2013.01); *H01L 33/52* (2013.01); *H01L 33/60* (2013.01); *H01L 2933/005* (2013.01); *H01L 2933/0041* (2013.01); *H01L 2933/0058* (2013.01); *H01L 2933/0091* (2013.01)

(58) Field of Classification Search
CPC ....... H01L 33/58; H01L 33/60; H01L 33/505; H01L 33/52; H01L 2933/0091; H01L 2933/0058; H01L 2933/0041; H01L 2933/005

See application file for complete search history.

(56) References Cited

U.S. PATENT DOCUMENTS

| | | |
|---|---|---|
| 2006/0163605 A1 | 7/2006 | Miyahara |
| 2006/0183625 A1 | 8/2006 | Miyahara |
| 2014/0048821 A1* | 2/2014 | Inoue ...................... H01L 33/32 |
| | | 257/76 |

FOREIGN PATENT DOCUMENTS

| | | |
|---|---|---|
| JP | 2005-035864 A | 2/2005 |
| JP | 2007-073912 A | 3/2007 |
| JP | 2013-012632 A | 1/2013 |
| JP | 2013-115088 A | 6/2013 |
| JP | 2017-152475 A | 8/2017 |
| WO | WO-2014/081042 A1 | 1/2017 |

\* cited by examiner

*Primary Examiner* — Stephen W Smoot
*Assistant Examiner* — Vicki B. Booker
(74) *Attorney, Agent, or Firm* — Foley & Lardner LLP

(57) ABSTRACT

A light-emitting device includes: a light-emitting element; a first light-diffusion layer disposed laterally to the light-emitting element and constituting a first portion of lateral surfaces of the light-emitting device; a second light-diffusion layer disposed above the light-emitting element and the first light-diffusion layer and constituting a second portion of the lateral surfaces of the light-emitting device; a light-control portion disposed between the first light-diffusion layer and the second light-diffusion layer and configured to reflect a portion of light emitted from the light-emitting element; and a first light-reflection layer disposed on the second light-diffusion layer.

22 Claims, 15 Drawing Sheets

LIGHT-EMITTING DEVICE

CROSS-REFERENCE TO RELATED APPLICATION

The present application claims priority to Japanese Patent Appl. No. 2018-184103, filed on Sep. 28, 2018, which is hereby incorporated by reference in its entirety.

BACKGROUND

The present disclosure relates to a light-emitting device.

For a light-emitting device including a light-emitting element, such as a light-emitting diode (LED), a light-emitting device having a wide light distribution has been proposed (see, for example, Japanese Patent Publication No. 2013-012632, PCT Publication No. WO2014/081042, Japanese Patent Publication No. 2013-115088, Japanese Patent Publication No. 2007-73912, and Japanese Patent Publication No. 2017-152475).

There is a need to control the direction of the light emitted laterally from the light-emitting device.

SUMMARY OF THE INVENTION

A light-emitting device according to an embodiment of the present disclosure includes: a light-emitting element, a first light-diffusion layer disposed laterally to the light-emitting element and constituting a portion of lateral surfaces of the light-emitting device, a second light-diffusion layer disposed above the light-emitting element and the first light-diffusion layer and constituting another portion of the lateral surfaces of the light-emitting device, a light-control portion disposed between the first light-diffusion layer and the second light-diffusion layer and reflecting a portion of light from the light-emitting element, and a first light-reflection layer disposed on the second light-diffusion layer.

A light-emitting device according to certain embodiments of the present disclosure controls the direction of the light emitted laterally from the light-emitting device.

DETAILED DESCRIPTION

Figure 1A:
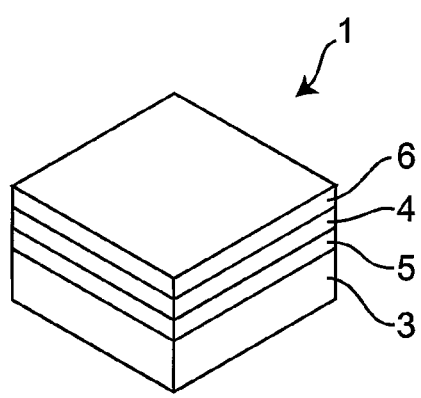
FIGS. 1A to 1D are schematic views showing a light-emitting device according to a first embodiment.
Figure 1B:
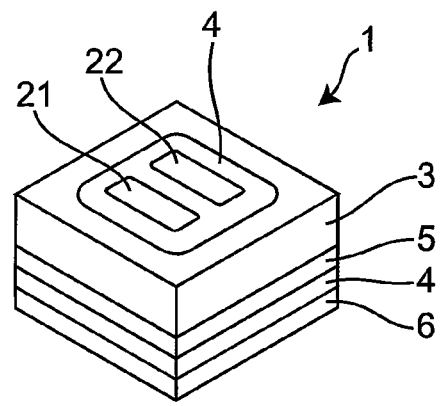

Hereinafter, light-emitting devices according embodiments of the present disclosure are described in detail with reference to the drawings. However, the following embodiments are intended for the purpose of illustration, and the present disclosure is not limited to the following embodiments. Dimensions, materials, shapes, relative arrangements, and the like of components described below are merely examples for explanation purposes, and the scope of the present disclosure is not limited thereto unless otherwise specified. In addition, the sizes, the shapes, the relative layouts, and the like of the components illustrated in the drawings are intentionally exaggerated in some cases for a clearer understanding of the description.

First Embodiment

A light-emitting device 1 according to a first embodiment of the present disclosure is shown in FIGS. 1A to 1D. FIGS. 1A to 1D are respectively a schematic perspective view as seen from above, a schematic perspective view as seen from below, a schematic top view, and a schematic sectional view of the light-emitting device 1. The light-emitting device 1 according to the first embodiment includes a light-emitting element 2, a first light-diffusion layer 3 disposed laterally to the light-emitting element 2 and constituting a portion of lateral surfaces (shown by reference numerals 11 and 12 in FIG. 1D) of the light-emitting device 1, a second light-diffusion layer 4 disposed above the light-emitting element 2 and the first light-diffusion layer 3 and constituting another portion of the lateral surfaces of the light-emitting device 1, a light-control portion 5 disposed between the first light-diffusion layer 3 and the second light-diffusion layer 4 and reflecting a portion of the light from the light-emitting element 2, and a first light-reflection layer 6 disposed on the second light-diffusion layer 4.

(Light-Emitting Element 2)

The light-emitting element 2 usable for the light-emitting device 1 according to the present embodiment is not particularly limited, and may be a semiconductor light-emitting element, such as a light-emitting diode (LED). The light-emitting element 2 has a pair of electrodes 21 and 22 on the same surface. In the case in which the electrodes 21 and 22 are made of an easily-oxidized material, such as Cu, metal films 201 and 202 are preferably provided on respective surfaces of the electrodes.

(First Light-Diffusion Layer 3)

The first light-diffusion layer 3 is disposed laterally to the light-emitting element 2 and constitutes a portion of the lateral surfaces (shown by reference numerals 11 and 12 in FIG. 1D) of the light-emitting device 1. The first light-diffusion layer 3 diffuses the light from the light-emitting element 2. As a result, the light from the light-emitting element 2 is laterally emitted efficiently.

The first light-diffusion layer 3 contains a light-diffusive material that diffuses the light from the light-emitting element 2. The first light-diffusion layer 3 may be a resin layer in which particles of the light-diffusive material are dispersed. The resin is not particularly limited as long as it is a light-transmissive resin, and may be, for example, a silicone resin, an epoxy resin, a phenol resin, a polycarbonate resin, an acrylic resin, or modified resins of these resins. For example, silica, titanium oxide, silicon oxide, aluminum oxide, potassium titanate, zinc oxide, boron nitride or the like that has an average particle diameter (volume-based median diameter) of about 0.1 μm to 30 μm can be used as the light-diffusive material. A content of the light-diffusive material in the first light-diffusion layer 3 may be 0.1 wt % to 70 wt % based on a total weight of the first light-diffusion layer 3.

(Second Light-Diffusion Layer 4)

The second light-diffusion layer 4 is disposed above the light-emitting element 2 and the first light-diffusion layer 3 and constitutes another portion of the lateral surfaces of the light-emitting device 1. Because the second light-diffusion layer 4 is provided, light-extraction efficiency in the lateral directions of the light-emitting device 1 is improved. As shown in FIG. 1D, the second light-diffusion layer 4 may be disposed in contact with the first light-diffusion layer 3. Alternatively, the second light-diffusion layer 4 may be set apart from the first light-diffusion layer 3. The second light-diffusion layer 4 may be made of the same material as the first light-diffusion layer 3. The first light-diffusion layer 3 and the second light-diffusion layer 4 may have the same composition or may have a different composition.

(Light-Control Portion 5)

The light-control portion 5 is a layer capable of reflecting a portion of the light from the light-emitting element 2. Arrangement of the light-control portion 5 between the first light-diffusion layer 3 and the second light-diffusion layer 4 enables control of a direction of the light emitted laterally from the light-emitting device 1. Each of the first light-diffusion layer 3 and the second light-diffusion layer 4 constituting a portion of the lateral surfaces of the light-emitting device 1 enables high light-extraction efficiency in the lateral directions of the light-emitting device 1. Adjustment of a position (position in a height direction of the light-emitting device 1) of the light-control portion 5 enables control of the light emitted in a direction other than a diagonally upward direction.

The light-control portion 5 may be a layer containing a light-reflective material, and may be, for example, a resin layer in which particles of the light-reflective material are dispersed. The resin is not particularly limited as long as it is a light-transmissive resin, and may be, for example, a silicone resin, an epoxy resin, a phenol resin, a polycarbonate resin, an acrylic resin, or modified resins of these resins. For example, titanium oxide, zinc oxide, aluminum oxide, silicon oxide, potassium titanate, boron nitride or the like that have an average particle diameter (volume-based median diameter) of about 0.1 μm to 0.5 μm can be used as the light-reflective material. A content of the light-reflective material in the light-control portion 5 may be 30 wt % to 70 wt % based on a total weight of the light-control portion 5. The light-control portion 5 may be a hollow as described later.

The light-control portion 5 is preferably a white member. In the case in which the light-control portion 5 is a white member, the direction of the light emitted laterally from the light-emitting device 1 is controlled more effectively.

Figure 1C:
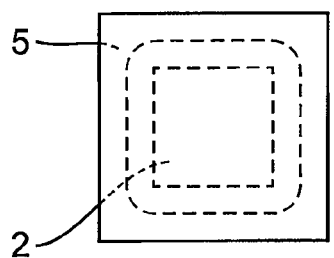
Figure 1D:
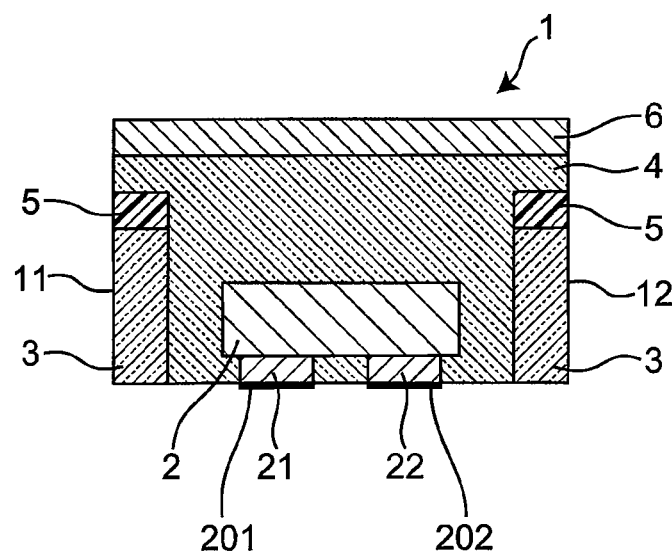

As shown in FIG. 1C, the light-control portion 5 is preferably disposed so as to surround an outer periphery of the light-emitting element 2 in a plan view. Such an arrangement of the light-control portion 5 enables control of the direction of the light emitted in all the lateral surfaces of the light-emitting device 1. For example, in a case of a light-emitting device having a quadrilateral shape in a top view, the direction of the emitted light can be controlled in each of the four lateral surfaces.

A size and position (relative positional relationship with other members) of the light-control portion 5 may be appropriately adjusted in accordance with desired characteristics. For example, as shown in FIG. 1D, a lower end of the light-control portion 5 may be positioned above an upper surface of the light-emitting element 2. This makes density of the light emitted from the first light-diffusion layer 3 high and the density of the light emitted from the second light-diffusion layer 4 low. Therefore, the density of the light emitted horizontally from the light-emitting device is made high. Alternatively, in order to dispose the light-control portion 5 laterally to the light-emitting element 2, an upper end of the light-control portion 5 may be positioned below the upper surface of the light-emitting element 2, and the lower end of the light-control portion 5 may be positioned above a lower surface of the light-emitting element 2. This makes the density of the light emitted from the first light-diffusion layer 3 low and the density of the light emitted from the second light-diffusion layer 4 high. Therefore, the density of the light emitted diagonally upward from the light-emitting device is made high.

As shown in FIGS. 1A to 1D, the light-control portion 5 may constitute still another portion of the lateral surfaces (shown by reference numerals 11 and 12 in FIG. 1D) of the light-emitting device 1, thereby enabling the light emitted from the first light-diffusion layer 3 to be controlled in a more horizontal direction and enabling the light emitted from the second light-diffusion layer 4 to be controlled in a more diagonally upward direction. In a configuration shown in FIGS. 1A to 1D, the light-control portion 5 is exposed on the lateral surfaces of the light-emitting device 1. Alternatively, the light-control portion 5 may be disposed apart from the lateral surfaces of the light-emitting device 1 as described later.

The light-control portion 5 is preferably arranged on an imaginary line connecting an outer edge of the upper surface of the light-emitting element 2 and an outer edge of a lower surface of the first light-reflection layer 6, thereby facilitating control of the light emitted from the light-emitting element 2 in the diagonally upward direction.

In the configuration shown in FIG. 1D, the light-control portion 5 has a substantially rectangular shape in a sectional view. The shape of the light-control portion is not limited to such a shape and, in a sectional view, may be any shape, such as a substantially polygonal shape, a substantially circular shape, a substantially semicircular shape, or a substantially elliptical shape. The substantially polygonal shape includes a substantially triangular shape, a substantially rhomboidal shape, a substantially trapezoidal shape, a substantially hexagonal shape and the like. In the configuration shown in FIGS. 1A to 1D, the light-control portion 5 has a constant shape in any section. Alternatively, the section of the light-control portion 5 may have a non-constant shape, and may change continuously or discontinuously.

(First Light-Reflection Layer 6)

The first light-reflection layer 6 is disposed on the second light-diffusion layer 4. The first light-reflection layer 6 may be a layer containing a light-reflective material, and may be, for example, a resin layer in which particles of the light-reflective material are dispersed. The resin is not particularly limited as long as it is a light-transmissive resin, and may be, for example, a silicone resin, an epoxy resin, a phenol resin, a polycarbonate resin, an acrylic resin, or modified resins of these resins. For example, titanium oxide, zinc oxide, aluminum oxide, silicon oxide, potassium titanate, boron nitride or the like that have an average particle diameter (volume-based median diameter) of about 0.1 μm to 0.5 μm can be used as the light-reflective material. A content of the light-reflective material in the first light-reflection layer 6 may be 30 wt % to 70 wt % based on a total weight of the light-reflection layer 6.

The first light-reflection layer 6 may be made of a light-reflective metal material as well as the resin layer described above. For example, metals such as Ag, Al, Pt, Ti, Ni, Fe, W, Au, Cu, Pd or alloys containing these metals can be used. Alternatively, the first light-reflection layer 6 may be made of a dielectric protective film. For example, a multilayer film in which $TiO_2$ and $SiO_2$ are alternately layered can be used. In addition to these materials, $Nb_2O_5$, $ZrO_2$, $Ta_2O_5$ or the like can be used as the dielectric protective film. The lower surface of the first light-reflection layer 6 (the surface in contact with an upper surface of the second light-diffusion layer) may be an inclined surface or a curved surface as well as a flat surface as shown in FIG. 1D. In the case in which the lower surface of the first light-reflection layer 6 has an inclined surface or a curved surface, the lower surface is preferably such that a distance to the lower surface of the first light-reflection layer 6 from the upper surface of the light-emitting element 2 is the shortest at an approximate center of the upper surface of the light-emitting element 2. With such a lower surface of the first light-reflection layer 6, the light emitted upward from the upper surface of the light-emitting element 2 is likely to be reflected in the lateral direction.

FIRST VARIANT EXAMPLE

A first variant example of the light-emitting device according to the first embodiment is described below with reference to FIGS. 2A to 2D. FIGS. 2A to 2D are respectively a schematic perspective view as seen from above, a schematic perspective view as seen from below, a schematic top view, and a schematic sectional view of a light-emitting device 1 of the first variant example. The light-emitting device 1 according to the first variant example differs from the light-emitting device shown in FIGS. 1A to 1D in that the light-emitting device 1 further includes a phosphor layer 8, and a second light-reflection layer 7 under the light-emitting element 2. Hereinafter, these different components are mainly described. Because the light-emitting device of the first variant example has the same configuration as the light-emitting device shown in FIGS. 1A to 1D except for these components, a description thereof is omitted. Also, for light-emitting devices according to second to fifth variant examples and second to eighth embodiments to be described later, descriptions of the same components as the light-emitting device shown in FIGS. 1A to 1D are omitted, and differences therebetween are mainly described.

The light-emitting device 1 according to the first variant example includes the phosphor layer 8 covering the light-emitting element 2. The first light-diffusion layer 3 and the second light-diffusion layer 4 cover the phosphor layer 8. In the case in which the light-emitting device 1 includes the phosphor layer 8, a phosphor contained in the phosphor layer 8 wavelength-converts a portion of primary light from the light-emitting element 2 into secondary light, and the secondary light is mixed with the primary light that has not been wavelength-converted to produce mixed color light. Because the phosphor layer 8 is provided, mixed color light with a desired color tone is obtained. Note that, depending on an amount of phosphors and the like, only the secondary light, which has been mainly wavelength-converted, can be emitted to outside.

The phosphor layer 8 contains a phosphor. The phosphor layer 8 may be a resin layer in which particles of a phosphor are dispersed. The resin is not particularly limited as long as it is a light-transmissive resin, and may be, for example, a silicone resin, an epoxy resin, a phenol resin, a polycarbonate resin, an acrylic resin, or modified resins of these resins. The phosphor may be, for example, cerium-activated yttrium aluminum garnet, cerium-activated lutetium aluminum garnet, cerium-activated terbium aluminum garnet, a nitrogen-containing calcium aluminosilicate activated with any one or two of europium and chromium, europium-activated SiAlON, a europium-activated silicate, or a manganese-activated potassium fluoride silicate. The phosphor layer 8 may contain one type of phosphor or may contain two or more different types of phosphors. The phosphor layer 8 may be a single layer or a layered body of a plurality of layers.

In addition, the light-emitting device 1 according to the first variant example further includes the second light-reflection layer 7 under the light-emitting element 2. The second light-reflection layer 7 is also disposed under the first light-diffusion layer 3 and the phosphor layer 8. The second light-reflection layer 7 is disposed such that the electrodes 21 and 22 of the light-emitting element 2 are exposed. With such a configuration, a lower surface of the light-emitting device 1 is composed of the electrodes 21 and 22 and the second light-reflection layer 7. Because the second light-reflection layer 7 is disposed on the lower surface of the light-emitting device 1, the light-extraction efficiency in the lateral directions of the light-emitting device 1 is further improved. The second light-reflection layer 7 may be made of the same material as the first light-reflection layer 6. However, the second light-reflection layer 7 is preferably made of an insulating material, because the second light-reflection layer 7 is in contact with the electrodes 21 and 22 of the light-emitting element 2. Although the light-emitting device 1 shown in FIGS. 2A to 2D is provided with both the phosphor layer 8 and the second light-reflection layer 7, the light-emitting device 1 may be provided with either one of the phosphor layer 8 or the second light-reflection layer 7.

The light-emitting device 1 shown in FIGS. 2A to 2D has the second light-diffusion layer 4 and the first light-diffusion layer 3 set apart from each other. In the case in which the second light-diffusion layer 4 is set apart from the first light-diffusion layer 3, the first light-diffusion layer 3 and the second light-diffusion layer 4 both containing different light-diffusive materials change the density of the light emitted laterally from the first light-diffusion layer 3 and the light emitted from the second light-diffusion layer 4.

Figure 2A:
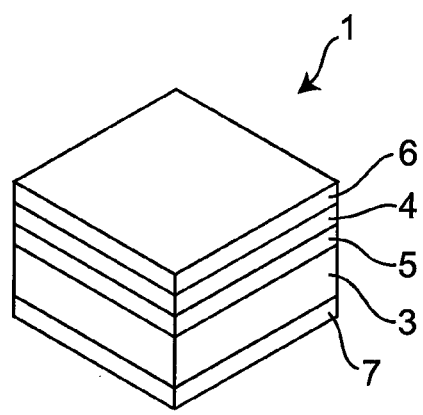
FIGS. 2A to 2D are schematic views showing a first variant example of the light-emitting device according to the first embodiment.
Figure 2B:
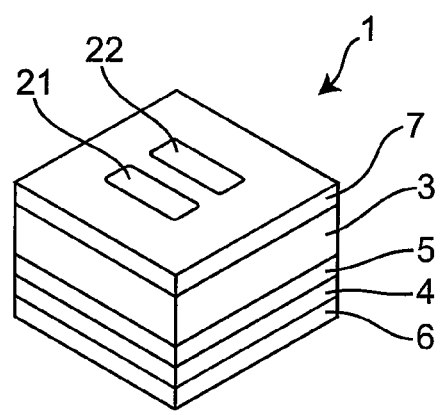
Figure 2C:
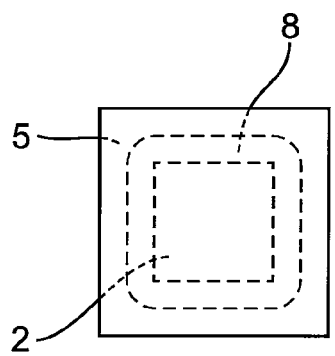
Figure 2D:
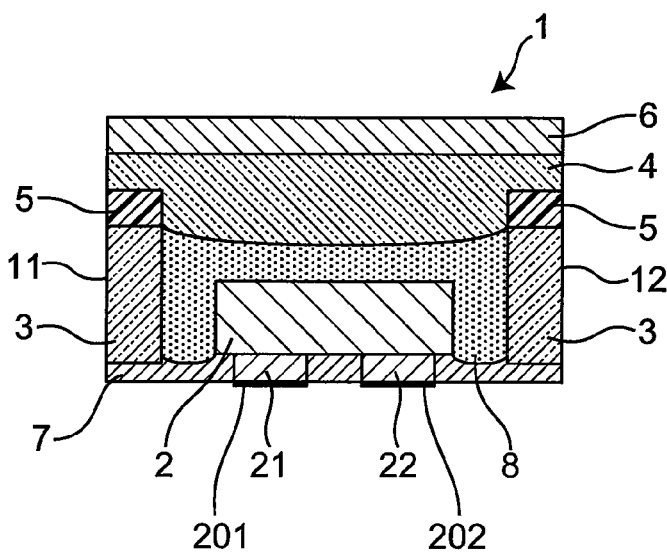

In the example shown in the schematic sectional view of FIG. 2D, an interface between the second light-diffusion layer 4 and the phosphor layer 8 is curvilinear. Specifically, a lower surface of the second light-diffusion layer 4 is convex downward, and an upper surface of the phosphor layer 8 is concave. In the case in which the second light-diffusion layer 4 and the phosphor layer 8 have different refractive indexes, such a shape reflects the light emitted diagonally upward from the light-emitting element 2 at the interface between the phosphor layer 8 and the second light-diffusion layer 4, thereby emitting the light from the first light-diffusion layer 3 through the phosphor layer 8. Therefore, the density of the light emitted horizontally from the light-emitting device is made high.

SECOND VARIANT EXAMPLE

Figure 3:
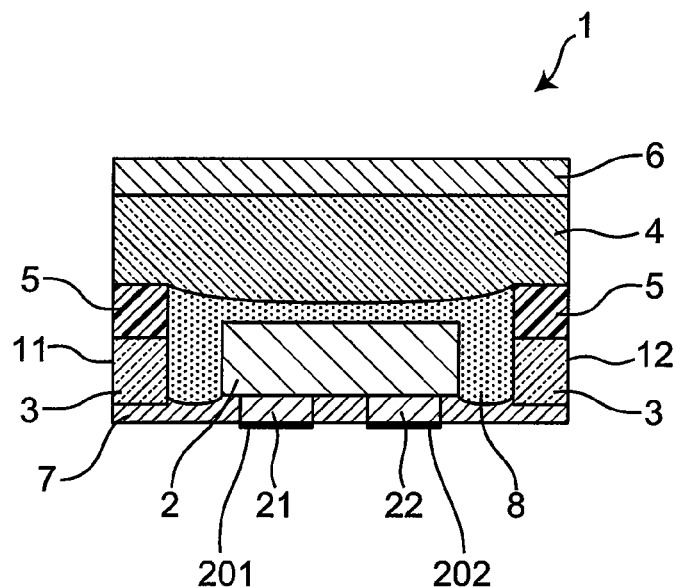
FIG. 3 is a schematic sectional view showing a second variant example of the light-emitting device according to the first embodiment.

FIG. 3 shows a schematic sectional view of a light-emitting device 1 according to a second variant example of the present embodiment. As shown in FIG. 3, a lower end of the light-control portion 5 may be positioned below the upper surface of the light-emitting element 2. In the case in which the lower end of the light-control portion 5 is positioned below the upper surface of the light-emitting element 2, the density of the light emitted from a first light-diffusion layer 3 is lower than in the first variant example. Also, the density of the light emitted from a second light-diffusion layer 4 is high. Therefore, the density of the light emitted diagonally upward from the light-emitting device is made higher than in the first variant example. A configuration shown in FIG. 3 has the second light-diffusion layer 4 set apart from the first light-diffusion layer 3.

In the light-emitting device 1 shown in FIG. 3, the second light-diffusion layer 4 is thicker than the first light-diffusion layer 3 at the lateral surfaces. Therefore, the density of the light (from the light-emitting element 2 through the second light-diffusion layer 4) emitted diagonally upward from the light-emitting device is higher than the light (from the light-emitting element 2 through the first light-diffusion layer 3) emitted horizontally from the lateral surfaces of the light-emitting device.

THIRD VARIANT EXAMPLE

Figure 4:
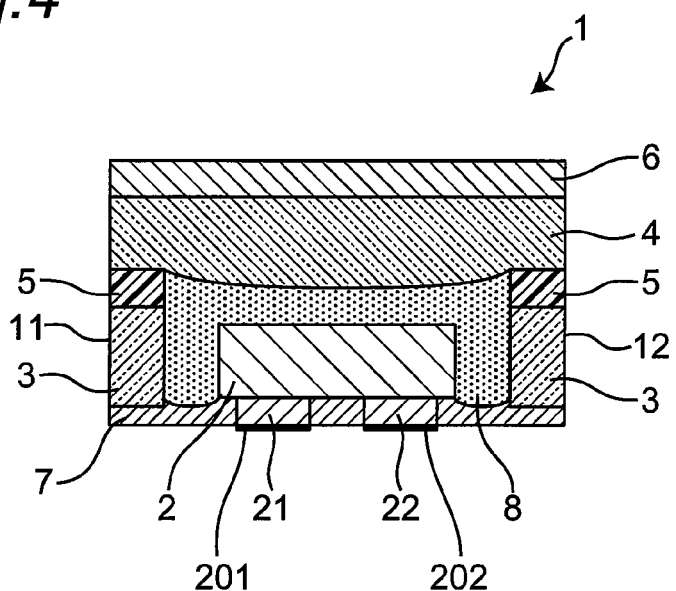
FIG. 4 is a schematic sectional view showing a third variant example of the light-emitting device according to the first embodiment.

FIG. 4 is a schematic sectional view of a light-emitting device 1 according to a third variant example of the present embodiment. In the third variant example, an upper end of the light-control portion 5 is positioned at the same height as an upper end of the phosphor layer 8. In the case in which the upper end of the light-control portion 5 has the same height as the upper end of the phosphor layer 8, the density of the light emitted from a second light-diffusion layer 4 is higher than in the first variant example. Therefore, the density of the light emitted diagonally upward from the light-emitting device is made higher than in the first variant example. A configuration shown in FIG. 4 has the second light-diffusion layer 4 set apart from a first light-diffusion layer 3.

FOURTH VARIANT EXAMPLE

Figure 5:
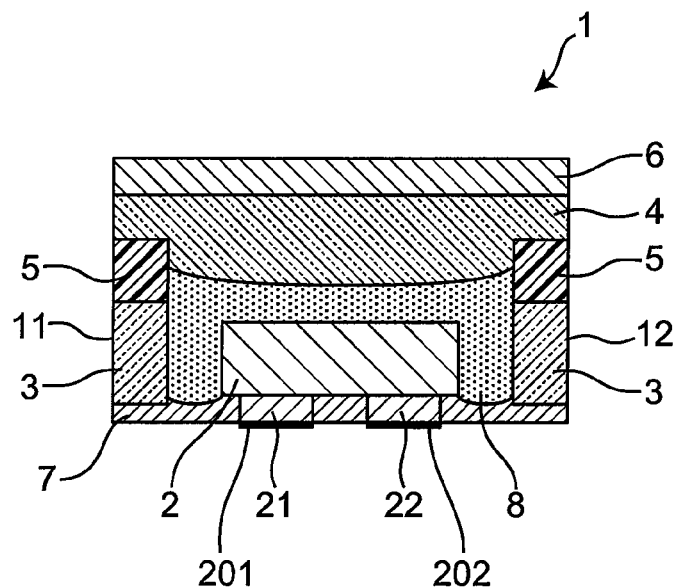
FIG. 5 is a schematic sectional view showing a fourth variant example of the light-emitting device according to the first embodiment.

FIG. 5 is a schematic sectional view of a light-emitting device 1 according to a fourth variant example of the present embodiment. In the fourth variant example, an upper end of the light-control portion 5 is positioned above an upper end of a phosphor layer 8. In the case in which the upper end of the light-control portion 5 is positioned above the upper end of the phosphor layer 8, the density of the light emitted from the second light-diffusion layer 4 is lower than in the second variant example. Therefore, the density of the light emitted diagonally upward from the light-emitting device is made lower than in the second variant example. A configuration shown in FIG. 5 has the second light-diffusion layer 4 set apart from a first light-diffusion layer 3.

FIFTH VARIANT EXAMPLE

Figure 6:
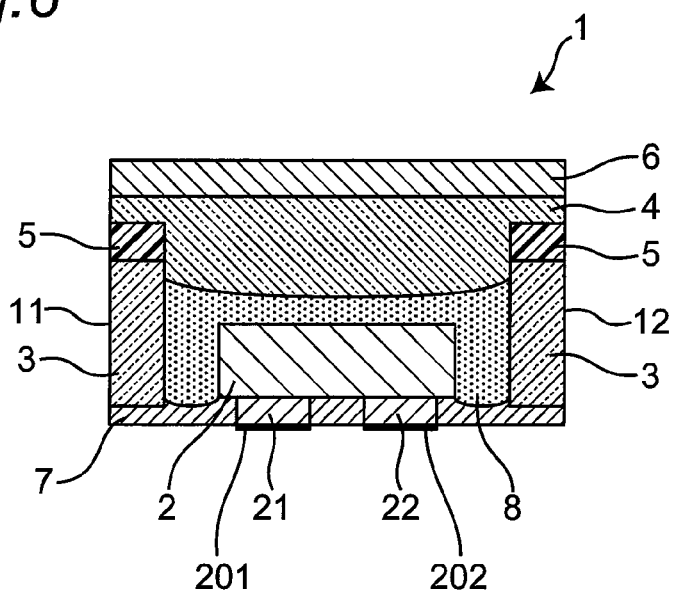
FIG. 6 is a schematic sectional view showing a fifth variant example of the light-emitting device according to the first embodiment.

FIG. 6 is a schematic sectional view of a light-emitting device 1 according to a fifth variant example of the present embodiment. In the fifth variant example, a lower end of the light-control portion 5 is positioned above an upper end of the phosphor layer 8. In the case in which the lower end of the light-control portion 5 is positioned above the upper end of the phosphor layer 8, the density of the light emitted from a first light-diffusion layer 3 is higher, and the density of the light emitted from a second light-diffusion layer 4 is lower than in the first variant example. Therefore, the density of the light emitted horizontally from the light-emitting device is made higher than in the first variant example. The configuration shown in FIG. 6 has the second light-diffusion layer 4 contacting the first light-diffusion layer 3.

(Method of Manufacturing Light-Emitting Device)

A method of manufacturing the light-emitting device 1 according to the present embodiment is described below with reference to FIGS. 7A to 7F, FIGS. 8A to 8F, and FIGS. 9A to 9C. However, the method of manufacturing the light-emitting device 1 according to the present embodiment is not limited to a method described below. Although the method of manufacturing the light-emitting device 1 shown in FIGS. 2A to 2D is described as an example, the light-emitting devices 1 shown in FIGS. 1A to 1D and FIG. 3 to FIG. 6 can also be manufactured by the same process.

Figure 7A:
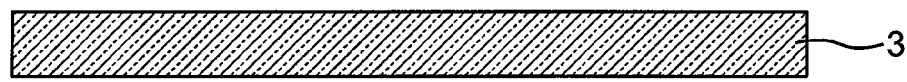
FIGS. 7A to 7F are schematic sectional views showing steps of a method of manufacturing the light-emitting device according to the first embodiment.

The first light-diffusion layer 3 is provided (FIG. 7A). The first light-diffusion layer 3 can be produced by compression molding of the resin containing the light-diffusive material at a predetermined concentration, or by another method. The thickness (height) of the first light-diffusion layer 3 can be adjusted by grinding or the like. The first light-diffusion layer 3 may be provided through the step described above or by purchasing the first light-diffusion layer 3 molded in advance.

Figure 7B:
Figure 7C:
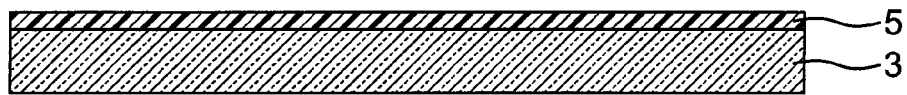

The light-control portion 5 is provided separately from the first light-diffusion layer 3 (FIG. 7B). The light-control portion 5 can be produced by compression molding of the resin containing the light-reflective material at a predetermined concentration. The thickness of the light-control portion 5 can be adjusted by grinding or the like. The light-control portion 5 may also be provided through the step described above or by purchasing the light-control portion 5 molded in advance.

Also in other embodiments, a light-reflection layer, a light-control portion, or the like used in the early stage of the process may be provided by purchasing one as well as through a forming step.

The first light-diffusion layer 3 and the light-control portion 5 described above are bonded to each other (FIG.

7C). An adhesive or an adhesive sheet may be used to perform the bonding. Alternatively, a material of the light-control portion 5 may be applied by printing, spraying or the like on the molded first light-diffusion layer 3. On the other hand, a material of the first light-diffusion layer 3 may be applied by printing, spraying or the like on the molded light-control portion 5.

Figure 7D:
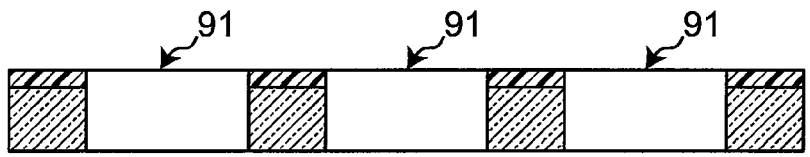

As shown in FIG. 7D, a hole 91 is formed in a layered body of the first light-diffusion layer 3 and the light-control portion 5 by punching or the like. The hole 91 is provided so as to correspond to an area in which the light-emitting element 2 is to be disposed.

Figure 7E:
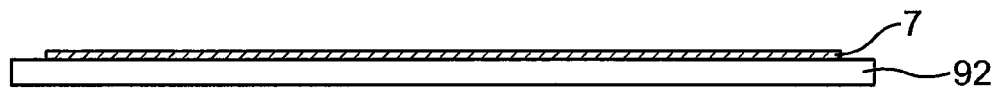

On the other hand, the second light-reflection layer 7 to be disposed under the light-emitting element 2 is provided (FIG. 7E). The second light-reflection layer 7 can be produced by applying a resin paste containing the light-reflective material at a predetermined concentration on a substrate 92, such as a support tape. Alternatively, a second light-reflection layer 7 molded in advance may be disposed on the substrate 92.

Figure 7F:
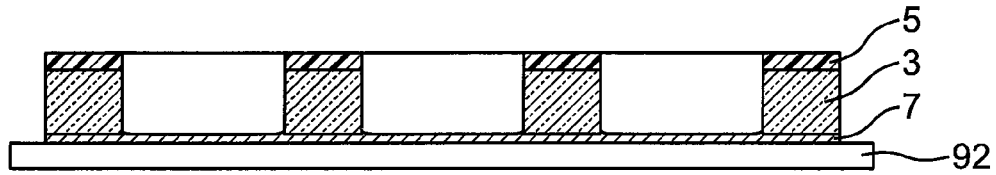

As shown in FIG. 7F, the layered body of the first light-diffusion layer 3 and the light-control portion 5 in which the hole 91 is formed is mounted on the second light-reflection layer 7.

Figure 8A:
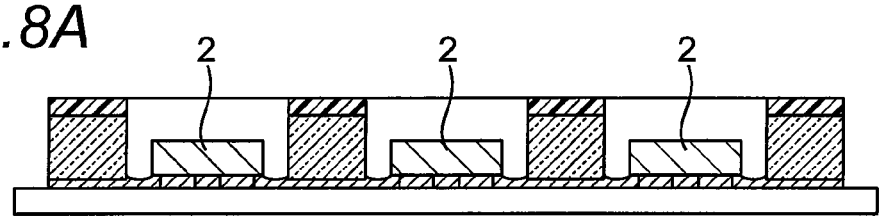
FIGS. 8A to 8F are schematic sectional views showing steps of the method of manufacturing the light-emitting device according to the first embodiment.
Figure 8B:
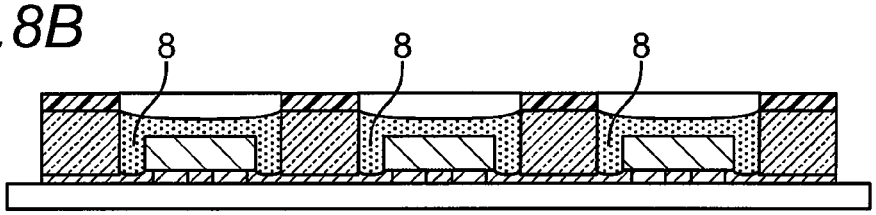

The light-emitting element 2 is disposed inside the hole 91 (FIG. 8A). Then, as shown in FIG. 8B, the hole 91 is filled with a resin paste containing the phosphor at a predetermined concentration so as to pot the light-emitting element 2, thereby forming the phosphor layer 8. In the example shown in FIG. 8B, the phosphor layer 8 is formed so as to have a height equal to or lower than an upper end of the first light-diffusion layer 3.

Figure 8C:
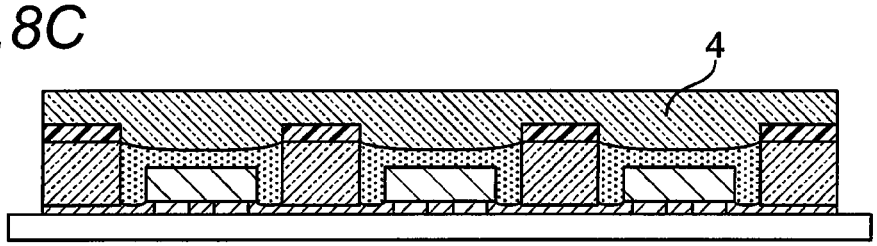
Figure 8D:
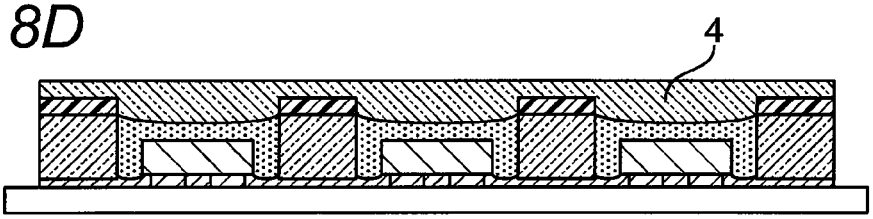

The second light-diffusion layer 4 is formed on the light-control portion 5 and the phosphor layer 8 by compression molding of the resin containing the light-diffusive material at a predetermined concentration (FIG. 8C). The thickness of the second light-diffusion layer 4 can be adjusted by grinding or the like (FIG. 8D).

Figure 8E:
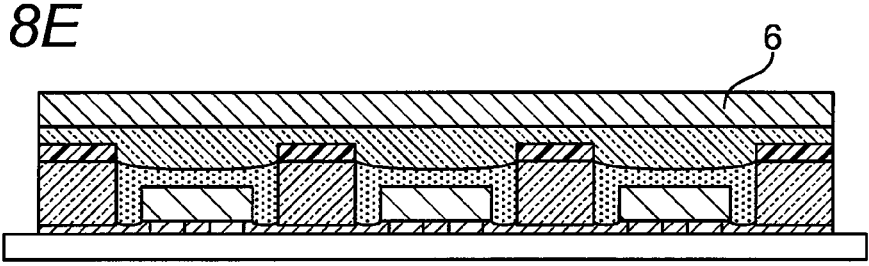
Figure 8F:
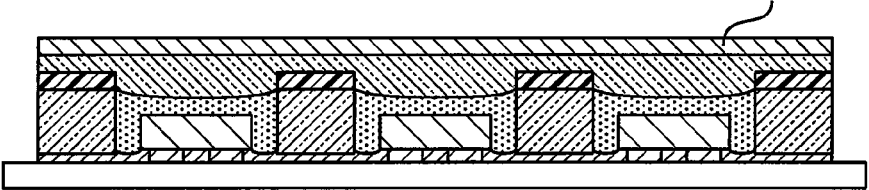

The first light-reflection layer 6 is formed on the second light-diffusion layer 4 by compression molding of the resin containing the light-reflective material at a predetermined concentration (FIG. 8E). The thickness of the first light-reflection layer 6 can be adjusted by grinding or the like (FIG. 8F).

Figure 9A:
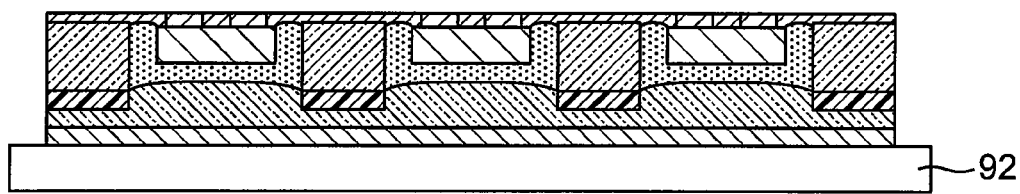
FIGS. 9A to 9C are schematic sectional views showing steps of the method of manufacturing the light-emitting device according to the first embodiment.
Figure 9B:
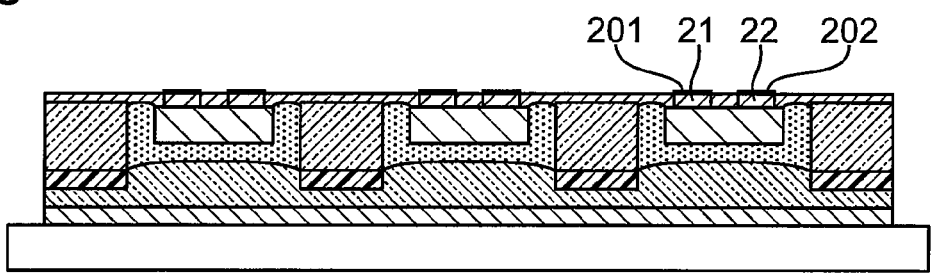

The first light-reflection layer 6 is transferred and bonded to a substrate 92, such as a support tape in FIG. 9A. Burrs of the second light-reflection layer 7 on the electrodes 21 and 22 are removed as necessary to expose the electrodes 21 and 22 of the light-emitting element 2 in FIG. 9B. In the case in which the electrodes 21 and 22 are made of easily-oxidized materials such as Cu, metal films 201 and 202 are preferably formed on surfaces of the electrodes by sputtering or the like.

Figure 9C:
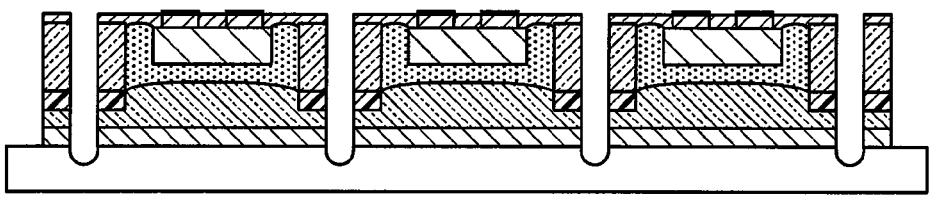
Figure 10A:
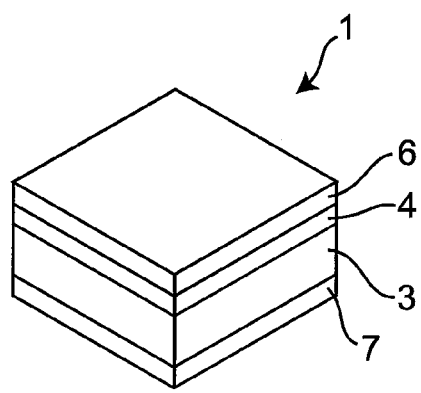
FIGS. 10A to 10D are schematic views showing a light-emitting device according to a second embodiment.
Figure 10B:
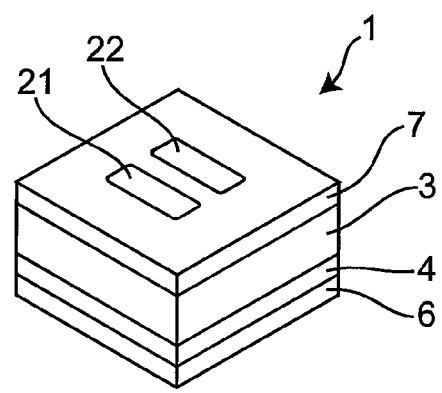
Figure 10C:
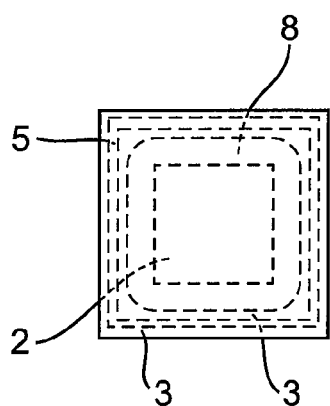
Figure 10D:
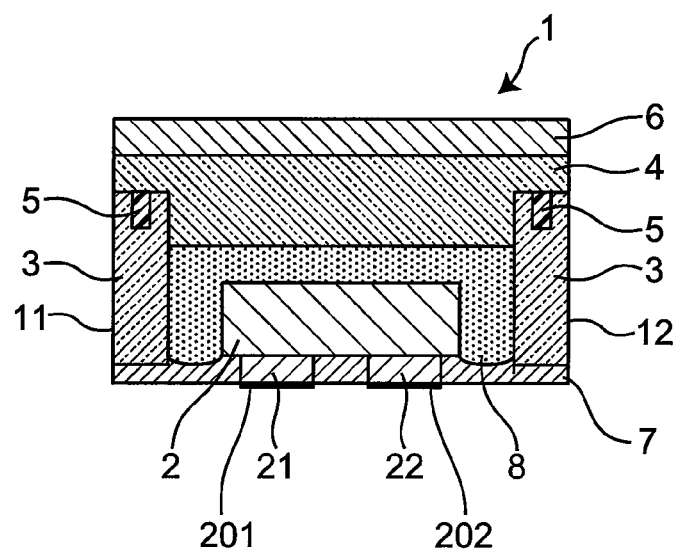

The layered body manufactured in the steps described above is cut by a dicer or the like to singulate (dice) the light-emitting devices, which have been formed in a connected manner, into pieces in FIG. 9C. Thus, the light-emitting device according to the present embodiment can be manufactured.

Second Embodiment

A light-emitting device according to a second embodiment of the present disclosure is described below with reference to FIGS. 10A to 10D. The light-emitting device 1 according to the second embodiment differs from the light-emitting device according to the first embodiment in that the light-control portion 5 is disposed apart from lateral surfaces of the light-emitting device 1. In the light-emitting device according to the second embodiment, the light-control portion 5 is disposed apart from the lateral surfaces of the light-emitting device 1. Therefore, light is efficiently emitted from the entire lateral surfaces of the light-emitting device. In the same way as the light-emitting device according to the first embodiment, the light-emitting device according to the second embodiment includes the light-control portion 5 disposed between the first light-diffusion layer 3 and the second light-diffusion layer 4. Therefore, the light-extraction efficiency in the lateral directions of the light-emitting device is improved, and the direction of the laterally emitted light is controlled. In the light-emitting device 1 according to the second embodiment, the light-control portion 5 may be a hollow. In the case in which the light-control portion 5 is a hollow, the light emitted from the light-emitting element 2 in a direction at a specific angle is reflected due to the differences in refractive index between the first light-diffusion layer 3, the second light-diffusion layer 4 and the hollow. Therefore, the density of the light emitted from the lateral surfaces of the light-emitting device is highly controlled. A configuration shown in FIGS. 10A to 10D has the second light-diffusion layer 4 contacting the first light-diffusion layer 3.

A method of manufacturing the light-emitting device 1 according to the second embodiment is described below with reference to FIGS. 11A to 11D. The light-emitting device 1 of the second embodiment can be manufactured by the same process as the method of manufacturing the light-emitting device 1 according to the first embodiment except for steps of forming the light-control portion 5. Therefore, the steps of forming the light-control portion 5 are mainly described below, and descriptions of the other steps are omitted.

Figure 11A:
FIGS. 11A to 11D are schematic sectional views showing steps of a method of manufacturing the light-emitting device according to the second embodiment.

The first light-diffusion layer 3 is formed by compression molding of the resin containing the light-diffusive material at a predetermined concentration (FIG. 11A). At this time, a recess is provided on a surface of the first light-diffusion layer 3 at a position where the light-control portion 5 is to be formed. The recess may be formed simultaneously with molding of the first light-diffusion layer or may be formed in a different step, such as by etching or the like, after forming the flat first light-diffusion layer. In other embodiments, in a case of a molded body provided with a recess, the recess may be formed simultaneously with molding of the molded body itself or may be formed in a step other than the molding.

Figure 11B:
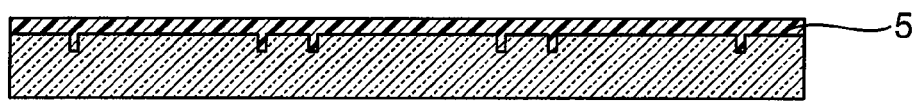

On the surface of the first light-diffusion layer 3 provided with the recess, the light-control portion 5 is formed by compression molding of the resin containing the light-reflective material at a predetermined concentration (FIG. 11B). At this time, the light-control portion 5 is formed such that the recess on the surface of the first light-diffusion layer 3 is filled with a portion of the light-control portion 5. FIG. 11B shows an example in which the light-reflective material is formed also in an area other than the recess. That is, an example in which light-control portions to be formed in a plurality of recesses are integrally formed is shown. Alternatively, the light-control portions may be formed only in the recesses or in the recesses and in the vicinity thereof, such that all or some of the light-control portions are set apart.

Figure 11C:

The thickness of each light-control portion 5 is adjusted by grinding a surface of the light-control portion 5 (FIG. 11C). As shown in FIG. 11C, after the thickness is adjusted, the light-control portion 5 exists only in the recess. In the case in which the light-control portion is a hollow, the formation of the light-control portion 5 described above is not performed.

Figure 11D:
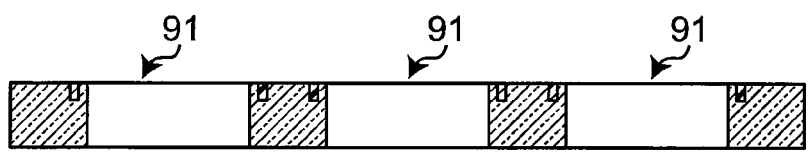

In the first light-diffusion layer 3 after the thickness is adjusted, a hole 91 is formed by punching or the like (FIG. 11D). The hole 91 is provided so as to correspond to an area in which the light-emitting element 2 is to be mounted. Thus, the light-control portion 5 is formed on the first light-diffusion layer 3.

Third Embodiment

Figure 12:
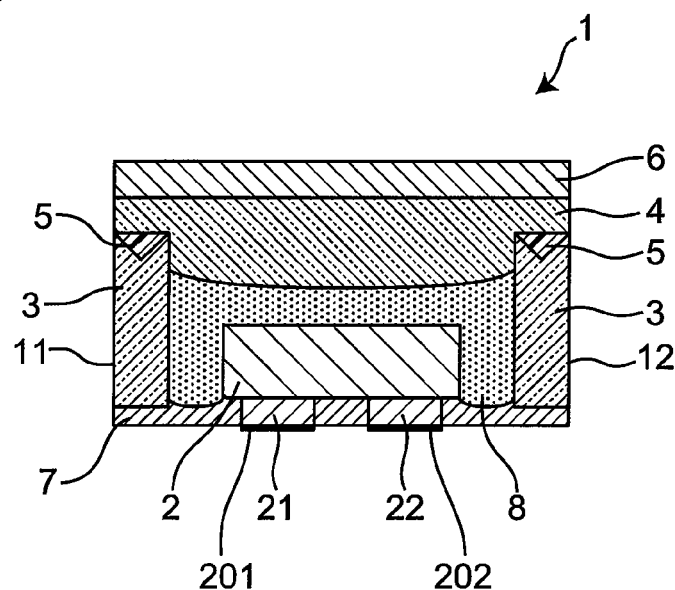
FIG. 12 is a schematic sectional view showing a light-emitting device according to a third embodiment.

A light-emitting device according to a third embodiment of the present disclosure is described below with reference to FIG. 12. The light-emitting device 1 according to the third embodiment differs from the light-emitting device of the first embodiment in the shape of the light-control portion 5. In the light-emitting device 1 according to the first embodiment, an upper surface and a lower surface of the light-control portion 5 are planes parallel to an upper surface and a lower surface of the light-emitting device. On the other hand, in the light-emitting device 1 according to the third embodiment, while an upper surface of the light-control portion 5 is parallel to an upper surface and a lower surface of the light-emitting device 1, a lower surface of the light-control portion 5 is composed of two inclined surfaces and is in the shape of an inverted triangle. Because the light-emitting device according to the third embodiment includes the light-control portion 5 having such a shape, light emitted diagonally upward at a specific angle from the light-emitting element 2 is reflected diagonally downward to change direction of travel of the light. Furthermore, the second light-reflection layer 7 reflects light that has been emitted diagonally downward from the light-emitting element 2, diagonally upward at a specific angle, and the light-control portion 5 reflects the light to travel in the horizontal direction. Therefore, the density of the light emitted horizontally from the light-emitting device is made higher.

Because the light-emitting device according to the third embodiment includes the light-control portion 5 disposed between the first light-diffusion layer 3 and the second light-diffusion layer 4, the light-extraction efficiency in the lateral directions of the light-emitting device is improved, and the direction of the laterally emitted light is controlled. The light-emitting device 1 according to the third embodiment includes the light-control portion 5 disposed apart from lateral surfaces of the light-emitting device 1. In the light-emitting device 1 according to the third embodiment, the light-control portion 5 may be a hollow. The configuration shown in FIG. 12 has the second light-diffusion layer 4 contacting the first light-diffusion layer 3.

The light-emitting device of the third embodiment can be manufactured by the same method as the light-emitting device of the second embodiment.

Fourth Embodiment

Figure 13:
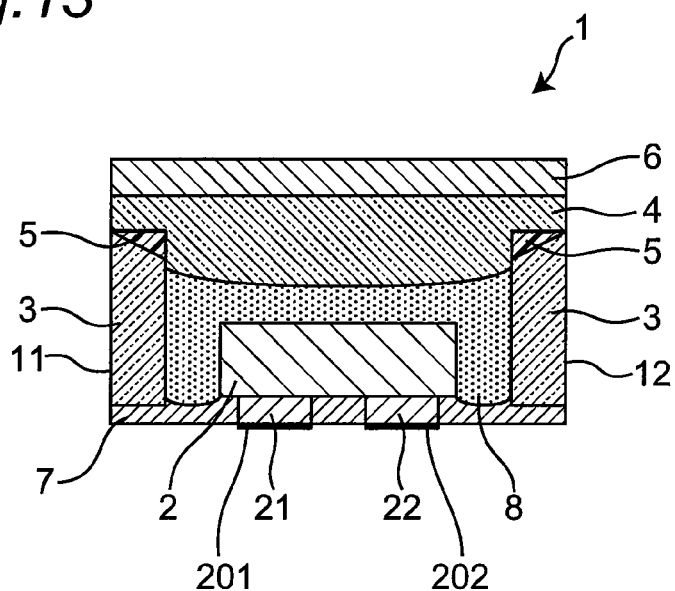
FIG. 13 is a schematic sectional view showing a light-emitting device according to a fourth embodiment.

A light-emitting device according to a fourth embodiment of the present disclosure is described below with reference to FIG. 13. The light-emitting device 1 according to the fourth embodiment differs from the light-emitting device of the first embodiment in the shape of the light-control portion 5. In the light-emitting device according to the fourth embodiment, while an upper surface of the light-control portion 5 is parallel to an upper surface and a lower surface of the light-emitting device 1, a lower surface of the light-control portion 5 is an inclined surface that is inclined downward toward an inside of the light-emitting device 1. Because the light-emitting device according to the fourth embodiment includes the light-control portion 5 having such a shape, the second light-reflection layer 7 reflects light that has been emitted diagonally downward from the light-emitting element 2 diagonally upward at a specific angle and the light-control portion 5 reflects the light in the horizontal direction. Therefore, the density of the light emitted horizontally from the light-emitting device is made high.

Also, in the same way as the light-emitting device according to the first embodiment, the light-emitting device according to the fourth embodiment includes the light-control portion 5 disposed between the first light-diffusion layer 3 and the second light-diffusion layer 4. Therefore, the light-extraction efficiency in the lateral directions of the light-emitting device is improved, and the direction of the laterally emitted light is controlled. The light-emitting device 1 according to the fourth embodiment includes the light-control portion 5 disposed apart from lateral surfaces of the light-emitting device 1. In the light-emitting device 1 according to the fourth embodiment, the light-control portion 5 may be a hollow. The configuration shown in FIG. 13 has the second light-diffusion layer 4 contacting the first light-diffusion layer 3.

The light-emitting device of the fourth embodiment can be manufactured by the same method as the light-emitting device of the second embodiment.

Fifth Embodiment

Figure 14:
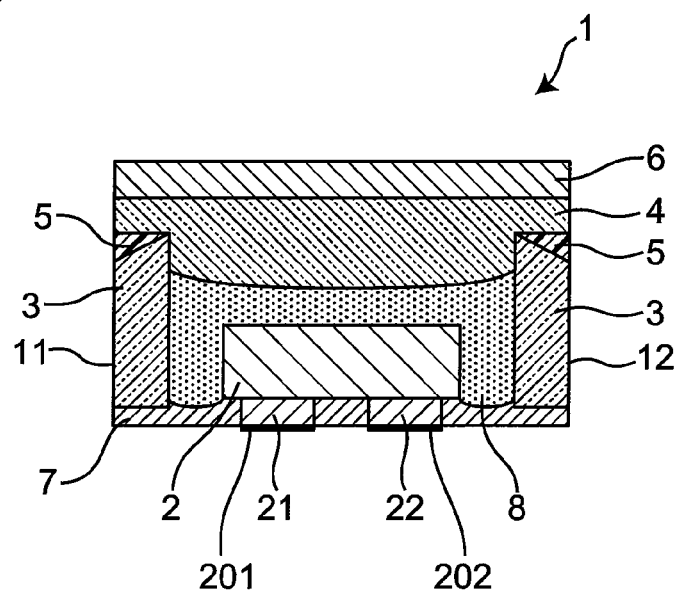
FIG. 14 is a schematic sectional view showing a light-emitting device according to a fifth embodiment.

A light-emitting device according to a fifth embodiment of the present disclosure is described below with reference to FIG. 14. The light-emitting device 1 according to the fifth embodiment differs from the light-emitting device of the first embodiment in the shape of the light-control portion 5. In the light-emitting device according to the fifth embodiment, while an upper surface of the light-control portion 5 is parallel to an upper surface and a lower surface of the light-emitting device 1, a lower surface of the light-control portion 5 is an inclined surface that is inclined toward a lateral surface of the light-emitting device 1. Because the light-emitting device according to the fifth embodiment includes the light-control portion 5 having such a shape, light that has been emitted diagonally upward at a specific angle from the light-emitting element 2 is reflected diagonally downward. Therefore, the density of the light emitted horizontally from the light-emitting device is made high.

Also, in the same way as the light-emitting device according to the first embodiment, the light-emitting device according to the fifth embodiment includes the light-control portion 5 disposed between the first light-diffusion layer 3 and the second light-diffusion layer 4. Therefore, the light-extraction efficiency in the lateral directions of the light-emitting device is improved, and the direction of the laterally emitted light is controlled. The light-emitting device 1 according to the fifth embodiment includes the light-control portion 5 constituting a portion of lateral surfaces of the light-emitting device 1. The configuration shown in FIG. 14 has the second light-diffusion layer 4 contacting the first light-diffusion layer 3.

The light-emitting device of the fifth embodiment can be manufactured by the same method as the light-emitting device of the second embodiment.

Sixth Embodiment

Figure 15:
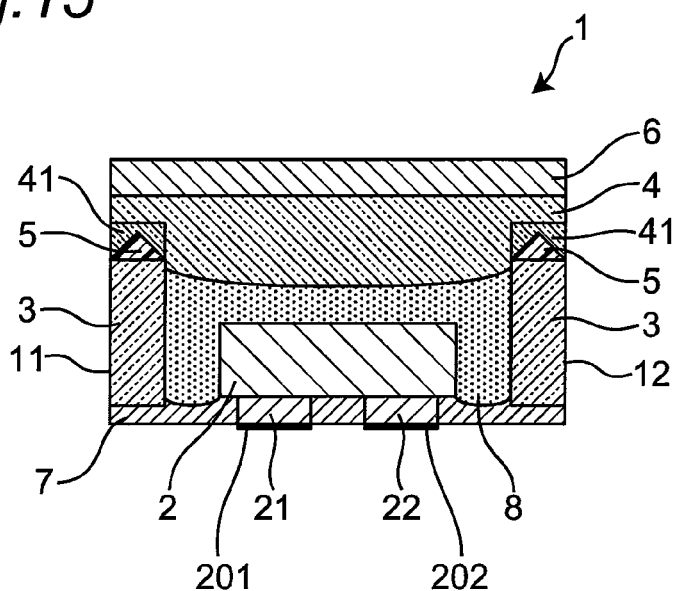
FIG. 15 is a schematic sectional view showing a light-emitting device according to a sixth embodiment.

A light-emitting device according to a sixth embodiment of the present disclosure is described below with reference to FIG. 15. The light-emitting device 1 according to the sixth embodiment differs from the light-emitting device of the first embodiment in the shape of the light-control portion 5. In the light-emitting device according to the sixth embodiment, while a lower surface of the light-control portion 5 is parallel to an upper surface and a lower surface of the light-emitting device 1, an upper surface of the light-control portion 5 is composed of two inclined surfaces. Because the light-emitting device according to the sixth embodiment includes the light-control portion 5 having such a shape, a first light-reflection layer 6 reflects light that has been emitted diagonally upward from the light-emitting element 2 diagonally downward at a specific angle and the light-control portion 5 reflects the light in the horizontal direction. Therefore, the density of the light emitted horizontally from the light-emitting device is made high.

Also, in the same way as the light-emitting device according to the first embodiment, the light-emitting device according to the sixth embodiment includes the light-control portion 5 disposed between a first light-diffusion layer 3 and a second light-diffusion layer 4. Therefore, the light-extraction efficiency in the lateral directions of the light-emitting device is improved, and the direction of the laterally emitted light is controlled.

In the sixth embodiment and seventh to eighth embodiments described later, the second light-diffusion layer is composed of two portions (respectively indicated by reference numerals 4 and 41), but the second light-diffusion layer may be integrally molded as one portion. The light-emitting device 1 according to the sixth embodiment includes the light-control portion 5 disposed apart from lateral surfaces of the light-emitting device 1. In the light-emitting device 1 according to the sixth embodiment, the light-control portion 5 may be a hollow. A configuration shown in FIG. 15 has the second light-diffusion layer 4 contacting the first light-diffusion layer 3.

A method of manufacturing the light-emitting device of the sixth embodiment is described later.

Seventh Embodiment

Figure 16:
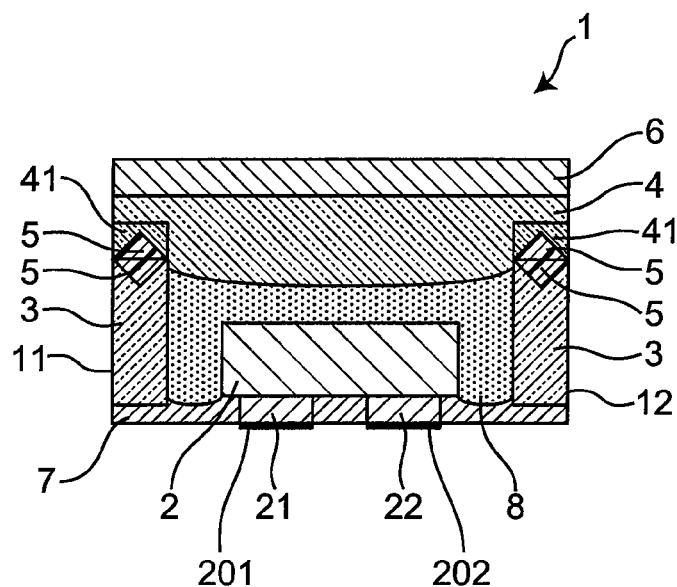
FIG. 16 is a schematic sectional view showing a light-emitting device according to a seventh embodiment.

A light-emitting device according to a seventh embodiment of the present disclosure is described below with reference to FIG. 16. The light-emitting device 1 according to the seventh embodiment differs from the light-emitting device of the first embodiment in the shape of the light-control portion 5. In the light-emitting device according to the seventh embodiment, an upper surface and a lower surface of the light-control portion 5 are each composed of two inclined surfaces, and the light-control portion 5 has a rhombic section. Because the light-emitting device according to the seventh embodiment includes the light-control portion 5 having such a shape, light that has been emitted diagonally upward at a specific angle from the light-emitting element 2 is reflected diagonally downward. In addition, a second light-reflection layer 7 reflects light that has been emitted diagonally downward from the light-emitting element 2 diagonally upward at a specific angle, and the light-control portion 5 reflects the light in the horizontal direction. Further, a first light-reflection layer 6 reflects light that has been emitted diagonally upward from the light-emitting element 2 diagonally downward, and the light-control portion 5 directs the light to the horizontal direction. Therefore, the density of the light emitted horizontally from the light-emitting device is made high.

Also, in the same way as the light-emitting device according to the first embodiment, the light-emitting device according to the seventh embodiment includes the light-control portion 5 disposed between a first light-diffusion layer 3 and a second light-diffusion layer 4. Therefore, the light-extraction efficiency in the lateral directions of the light-emitting device is improved, and the direction of the laterally emitted light is controlled. The light-emitting device 1 according to the seventh embodiment includes the light-control portion 5 disposed apart from lateral surfaces of the light-emitting device 1. The configuration shown in FIG. 16 has the second light-diffusion layer 4 contacting the first light-diffusion layer 3.

A method of manufacturing the light-emitting device of the seventh embodiment is described later.

Eighth Embodiment

Figure 17:
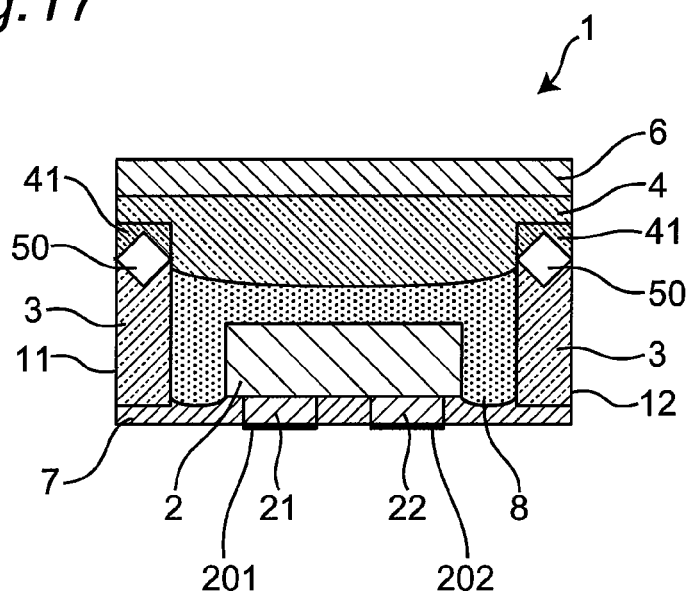
FIG. 17 is a schematic sectional view showing a light-emitting device according to an eighth embodiment.

A light-emitting device according to an eighth embodiment of the present disclosure is described below with reference to FIG. 17. The light-emitting device 1 according to the eighth embodiment differs from the light-emitting device of the first embodiment in the configuration of the light-control portion 5. In the light-emitting device according to the eighth embodiment, an upper surface and a lower surface of the light-control portion 5 are each composed of two inclined surfaces, and the light-control portion 5 has a rhombic section. In the light-emitting device 1 according to the eighth embodiment, the light-control portion 5 is a hollow 50. Because the light-emitting device according to the eighth embodiment includes the light-control portion 5 having such a configuration, light that has been emitted at a specific angle from the light-emitting element 2 is reflected by differences in refractive index between the first light-diffusion layer 3, the second light-diffusion layer 4 and the hollow. Therefore, the density of the light emitted from the lateral surfaces of the light-emitting device is highly controlled.

Also, in the same way as the light-emitting device according to the first embodiment, the light-emitting device according to the eighth embodiment improves the light-extraction efficiency in the lateral directions. The light-emitting device 1 according to the eighth embodiment includes the light-control portion 5 disposed apart from lateral surfaces of the light-emitting device 1. The configuration shown in FIG. 17 has the second light-diffusion layer 4 contacting the first light-diffusion layer 3.

A method of manufacturing the light-emitting devices 1 according to the sixth to eighth embodiments is described below with reference to FIGS. 18A to 18F and FIGS. 19A and 19B. The light-emitting devices 1 of the sixth to eighth embodiments can be manufactured by the same process as the method of manufacturing the light-emitting device 1 according to the first embodiment except for steps of forming the light-control portion 5. Therefore, the steps of forming the light-control portion 5 are mainly described below, and descriptions of the other steps are omitted. Although the method of manufacturing the light-emitting device 1 of the seventh embodiment shown in FIG. 16 is described as an example, the light-emitting devices 1 of the sixth and eighth embodiments shown in FIG. 15 and FIG. 17 can also be manufactured by the same process.

Figure 18A:
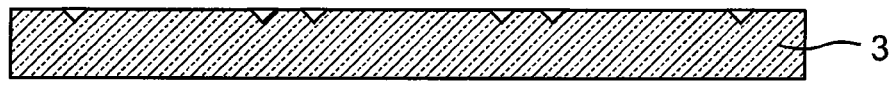
FIGS. 18A to 18F are schematic sectional views showing steps of a method of manufacturing the light-emitting device according to the sixth to eighth embodiments.

The first light-diffusion layer 3 is formed by compression molding of the resin containing the light-diffusive material at a predetermined concentration (FIG. 18A). A surface of the first light-diffusion layer 3 is provided with a recess at a position where the light-control portion 5 is to be formed.

Figure 18B:
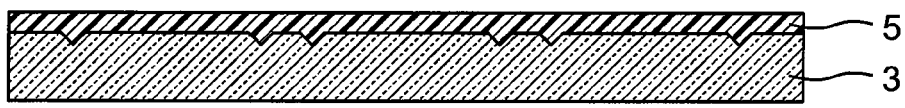
Figure 18C:

On the surface of the first light-diffusion layer 3 provided with the recess, the light-control portion 5 is formed by compression molding of the resin containing the light-reflective material at a predetermined concentration (FIG. 18B). At this time, the light-control portion 5 is formed such that the recess on the surface of the first light-diffusion layer 3 is filled with a portion of the light-control portion 5. The thickness of the light-control portion 5 is adjusted by grinding a surface of the light-control portion 5 (FIG. 18C). As shown in FIG. 18C, after the thickness is adjusted, the light-control portion 5 exists only in the recess. In the case in which the light-control portion is a hollow, the formation of the light-control portion 5 described above is not performed.

Figure 18D:

A second light-diffusion layer 41 is formed by compression molding the resin containing the light-diffusive material at a predetermined concentration (FIG. 18D). A surface of the second light-diffusion layer 41 is provided with a recess at a position where the light-control portion 5 is to be formed.

Figure 18E:
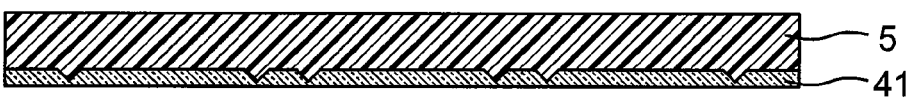
Figure 18F:

On the surface of the second light-diffusion layer 41 provided with the recess, the light-control portion 5 is formed by compression molding of the resin containing the light-reflective material at a predetermined concentration (FIG. 18E). At this time, the light-control portion 5 is formed such that the recess on the surface of the second light-diffusion layer 41 is filled with a portion of the light-control portion 5. The thickness of the light-control portion 5 is adjusted by grinding a surface of the light-control portion 5 (FIG. 18F). As shown in FIG. 18F, after the thickness is adjusted, the light-control portion 5 exists only in the recess. In the case in which the light-control portion is a hollow, the formation of the light-control portion 5 described above is not performed.

Figure 19A:
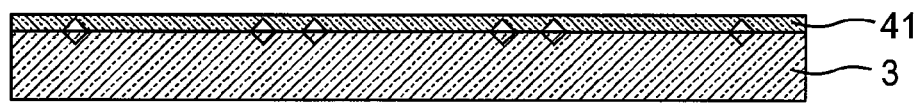
FIGS. 19A and 19B are schematic sectional views showing steps of the method of manufacturing the light-emitting device according to the sixth to eighth embodiments.

The first light-diffusion layer 3 and the second light-diffusion layer 41 are bonded to each other as shown in FIG. 19A. An adhesive or an adhesive sheet may be used to perform the bonding.

Figure 19B:
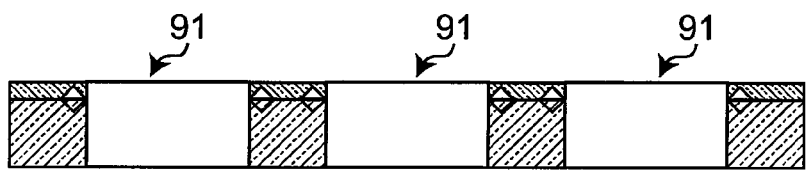

As described above, a hole 91 is formed by punching or the like in a layered body of the first light-diffusion layer 3 and the second light-diffusion layer 41 bonded to each other in FIG. 19B. The hole 91 is provided so as to correspond to an area in which the light-emitting element 2 is to be mounted. Thus, the light-control portion 5 is formed.

Figure 20A:
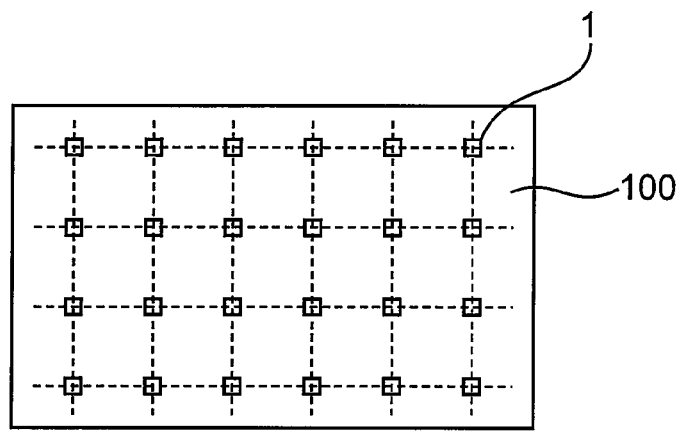
FIGS. 20A and 20B are schematic views showing a usage example of the light-emitting device according to the present disclosure.
Figure 20B:
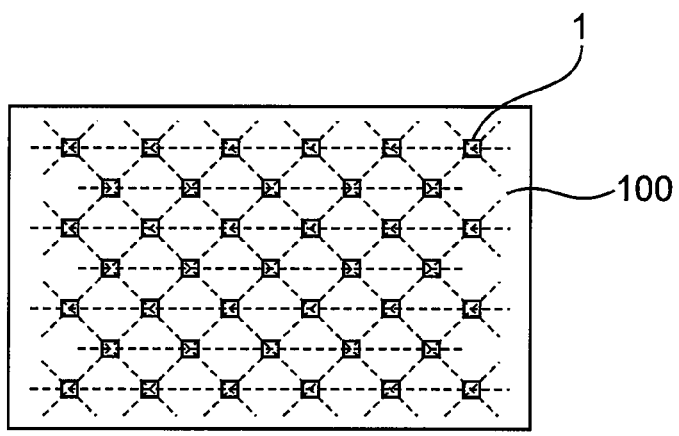

The light-emitting device according to the present disclosure can be used in a wide range of applications, for example, as a light-emitting device for a backlight of a liquid crystal display. An example in which the light-emitting device according to the present disclosure is used as a backlight is described below with reference to FIGS. 20A and 20B. FIGS. 20A and 20B are top views of a backlight unit in which a plurality of light-emitting devices 1 are disposed on a surface of a substrate 100. The light-emitting devices according to the present disclosure have high light-extraction efficiency and control the light emitted from the lateral surfaces. Therefore, the light-emitting devices 1 disposed on the surface of the substrate 100 provide desired light-emission characteristics. The light-emitting devices according to the present disclosure can be arranged in any pattern on the surface of the substrate 100. For example, as shown in FIG. 20A, a light-emitting device 1 may be disposed at each intersection of a grid formed by straight lines parallel to a long side of the substrate and other straight lines parallel to a short side of the substrate. Alternatively, as shown in FIG. 20B, the light-emitting device 1 may be disposed at each intersection of a grid obtained by rotating the grid shown in FIG. 20A by 45 degrees.

The present disclosure includes following aspects, but is not limited to these aspects.

(Aspect 1)
A light-emitting device including:
a light-emitting element;
a first light-diffusion layer disposed laterally to the light-emitting element and constituting a portion of lateral surfaces of the light-emitting device;
a second light-diffusion layer disposed above the light-emitting element and the first light-diffusion layer and constituting another portion of the lateral surfaces of the light-emitting device;
a light-control portion disposed between the first light-diffusion layer and the second light-diffusion layer and reflecting a portion of light from the light-emitting element; and
a first light-reflection layer disposed on the second light-diffusion layer.

(Aspect 2)
The light-emitting device according to aspect 1, in which the light-control portion is disposed so as to surround an outer periphery of the light-emitting element in a plan view.

(Aspect 3)
The light-emitting device according to aspect 1 or 2, in which the second light-diffusion layer is set apart from the first light-diffusion layer.

(Aspect 4)
The light-emitting device according to aspect 1 or 2, in which the second light-diffusion layer is in contact with the first light-diffusion layer.

(Aspect 5)
The light-emitting device according to any one of aspects 1 to 4, in which a lower end of the light-control portion is positioned above a lower surface of the light-emitting element.

(Aspect 6)
The light-emitting device according to aspect 5, in which the lower end of the light-control portion is positioned above an upper surface of the light-emitting element.

(Aspect 7)
The light-emitting device according to any one of aspects 1 to 6, in which the light-control portion constitutes still another portion of the lateral surfaces of the light-emitting device.

(Aspect 8)
The light-emitting device according to any one of aspects 1 to 6, in which the light-control portion is disposed apart from the lateral surfaces of the light-emitting device.

(Aspect 9)
The light-emitting device according to any one of aspects 1 to 8, in which the light-control portion is a white member.

(Aspect 10)
The light-emitting device according to aspect 8, in which the light-control portion is a hollow.

(Aspect 11)
The light-emitting device according to any one of aspects 1 to 10, includes a phosphor layer covering the light-emitting element, and the first light-diffusion layer and the second light-diffusion layer cover the phosphor layer.

(Aspect 12)
The light-emitting device according to aspect 11, in which an upper end of the light-control portion is positioned above an upper end of the phosphor layer.

(Aspect 13)
The light-emitting device according to aspect 12, in which the lower end of the light-control portion is positioned above the upper end of the phosphor layer.

(Aspect 14)

The light-emitting device according to any one of aspects 1 to 13, further includes a second light-reflection layer under the light-emitting element.

The light-emitting devices according to the present disclosure can be used in a wide range of applications such as a backlight for a display.

The invention claimed is:

1. A light-emitting device comprising:
    a light-emitting element;
    a phosphor layer covering the light-emitting element;
    a first light-diffusion layer disposed laterally to the light-emitting element and constituting a first portion of lateral surfaces of the light-emitting device;
    a second light-diffusion layer disposed above the light-emitting element and the first light-diffusion layer and constituting a second portion of the lateral surfaces of the light-emitting device;
    a light-control portion disposed between the first light-diffusion layer and the second light-diffusion layer and configured to reflect a portion of light emitted from the light-emitting element; and
    a first light-reflection layer disposed on the second light-diffusion layer;
    wherein the first light-diffusion layer and the second light-diffusion layer cover the phosphor layer.

2. The light-emitting device according to claim 1, wherein the light-control portion surrounds an outer periphery of the light-emitting element in a plan view.

3. The light-emitting device according to claim 1, wherein the second light-diffusion layer spaced from the first light-diffusion layer.

4. The light-emitting device according to claim 1, wherein the second light-diffusion layer is in contact with the first light-diffusion layer.

5. The light-emitting device according to claim 1, wherein a lower end of the light-control portion is positioned above a lower surface of the light-emitting element.

6. The light-emitting device according to claim 5, wherein the lower end of the light-control portion is positioned above an upper surface of the light-emitting element.

7. The light-emitting device according to claim 1, wherein the light-control portion constitutes a third portion of the lateral surfaces of the light-emitting device.

8. The light-emitting device according to claim 1, wherein the light-control portion is spaced from the lateral surfaces of the light-emitting device.

9. The light-emitting device according to claim 8, wherein the light-control portion is a hollow.

10. The light-emitting device according to claim 1, wherein the light-control portion is a white member.

11. The light-emitting device according to claim 1, wherein an upper end of the light-control portion is positioned above an upper end of the phosphor layer.

12. The light-emitting device according to claim 11, wherein a lower end of the light-control portion is positioned above the upper end of the phosphor layer.

13. The light-emitting device according to claim 1, further comprising:
    a second light-reflection layer under the light-emitting element.

14. A light-emitting device comprising:
    a light-emitting element;
    a first light-diffusion layer disposed laterally to the light-emitting element and constituting a first portion of lateral surfaces of the light-emitting device;
    a second light-diffusion layer disposed above the light-emitting element and the first light-diffusion layer and constituting a second portion of the lateral surfaces of the light-emitting device;
    a light-control portion disposed between the first light-diffusion layer and the second light-diffusion layer and configured to reflect a portion of light emitted from the light-emitting element; and
    a first light-reflection layer disposed on the second light-diffusion layer; and
    a second light-reflection layer under the light-emitting element.

15. The light-emitting device according to claim 14, wherein the light-control portion surrounds an outer periphery of the light-emitting element in a plan view.

16. The light-emitting device according to claim 14, wherein the second light-diffusion layer spaced from the first light-diffusion layer.

17. The light-emitting device according to claim 14, wherein the second light-diffusion layer is in contact with the first light-diffusion layer.

18. The light-emitting device according to claim 14, wherein a lower end of the light-control portion is positioned above a lower surface of the light-emitting element.

19. The light-emitting device according to claim 18, wherein the lower end of the light-control portion is positioned above an upper surface of the light-emitting element.

20. The light-emitting device according to claim 14, wherein the light-control portion constitutes a third portion of the lateral surfaces of the light-emitting device.

21. The light-emitting device according to claim 14, wherein the light-control portion is spaced from the lateral surfaces of the light-emitting device.

22. The light-emitting device according to claim 14, wherein the light-control portion is a white member.

* * * * *